United States Patent [19]

Chen et al.

[11] Patent Number: 5,217,599
[45] Date of Patent: Jun. 8, 1993

[54] BONDING OF POLYIMIDE FILM

[75] Inventors: Ker-Ming Chen; Syh-Ming Ho, both of Hsinchu; Tsung-Hsiung Wang, Taipei; Richard P. Cheng; Aina Hung, both of Hsinchu, all of Taiwan

[73] Assignee: Industrial Technology Research Institute, Taiwan

[21] Appl. No.: 790,260

[22] Filed: Nov. 8, 1991

[51] Int. Cl.$^5$ .................. C25D 5/48; C25D 5/00; C25D 3/12; C25D 3/38

[52] U.S. Cl. ..................... 205/196; 205/263; 205/264; 205/265; 205/267; 205/277; 205/290; 205/297

[58] Field of Search ............... 205/298, 297, 296, 253, 205/289, 290, 263, 264, 265, 267, 269, 270, 277, 279, 280, 302, 196, 303, 916, 307, 310, 312

[56] References Cited

U.S. PATENT DOCUMENTS 4,246,077 1/1981 Hradil et al. ..................... 205/242
4,406,755 9/1983 Morrissey ..................... 205/265

Primary Examiner—John Niebling
Assistant Examiner—John S. Starsiak, Jr.
Attorney, Agent, or Firm—Ladas & Parry

[57] ABSTRACT

Disclosed is a method for electroplating a metal sheet adapted for being used in electronic packaging material, such as printed circuit boards. Bismaleimide and its derivative are added into the plated solution so as to form insoluble particles of bismaleimide and its derivatives on the surface of the metal sheet. The resulting metal sheet is particularly adapted for being bonded to a polyimide film for the preparation of, for example, a printed circuit board. Also disclosed is a method of bonding the metal sheet of the present invention to a polyimide substrate. Precursor of polyimide are coated on the surface of the plate metal sheet and then thermal imidizing of the precursors takes place. No additional adhesives are needed for this bonding.

17 Claims, No Drawings

BONDING OF POLYIMIDE FILM

BACKGROUND OF THE INVENTION

The present invention relates to a method for the bonding of polyimide film, and in particular to a method of improving the bond strength of polyimide film bonding to a metal sheet, e.g. a copper foil.

Some kinds of synthetic polymers are used as a substrate in the production of printed electronic circuits. Since polyimide has the characteristics of good thermal stability, low dielectric constant, chemical resistance and easy processing, it is widely used in the production of electronic packaging materials, such as multichip module, flexible printed circuit boards and tape automatic bonding, etc. In addition, polyimide can improve the signal propagation and reduce the crosstalk of the resulting product when it is bonded to a metal foil. Although polyimide material has the above advantages, the bond strength between the polyimide substrate and a metal foil is poor. Therefore, it is important for a technique to be developed to increase the bond strength of polyimide substrate when it is bonded to metal foils.

Conventionally, a polyimide film is bonded to a metal foil, usually a copper foil, for use in the production of printed electronic circuits. In order to improve the bond strength of the polyimide film, the copper foil is electroplated in a copper plated solution, wherein the copper foil is used as a cathode so that a rough layer of copper is formed thereon. This rough layer can increase the bond strength between the copper foil and the polyimide film, but the deposited copper easily develops into dendrite even after etching, and therefore the quality of the product is affected.

A method for improving the bonding between copper foil and polymer substrate is disclosed in U.S. Pat. No. 4,010,005, in which a copper foil is electroplated in a plating solution which contains a suspension of insoluble fine particles of epoxy resin, silica powder and barium sulfate, and a metal containing plate of insoluble fine particles is formed thereon. The copper foil thus prepared is bonded to epoxy resin-impregnated glass cloth. It is found that the bond strength has been increased. The bond strength of the copper foil prepared by this method when bonding to a polyimide substrate is not mentioned in said U.S. Patent.

However, it is found that the copper foil prepared by the method disclosed in said U.S. Patent is not suitable for an electroplation in a metal plated solution with a high temperature, e.g. above 50° C., because the plating solution contains epoxy resins which have a low softening point and will soften in the heated metal plated solution to form a film to resist the deposition of metal. In addition, the copper foil prepared from the epoxy resin containing plating solution can not be used for bonding on a polyimide substrate, because the resulting product usually will be subject to a subsequent process involving temperatures greater than 180° C.

In addition, the adhesives which were available for the bonding of metal foils, particularly copper foils, to polyimide substrate were not heat-resistant enough, and resulted in poor peeling resistance of the bonding.

SUMMARY OF THE INVENTION

The first object of the present invention is to provide a method for preparing a metal foil having high bond strength, which can be prepared from a metal plated solution having a temperature higher than 50° C.

The second object of this invention is to provide a method for preparing a metal foil which is stable thermally and therefore is suitable to be subjected to a subsequent process involving a temperature greater than 180° C. and accordingly suitable to be bonded on a polyimide substrate.

The third object of the present invention is to provide a method of bonding metal foil to polyimide substrate, by which method no additional adhesives are needed and the bonding is acceptable.

The first and second object of the present invention can be attained by the provision of a metal foil on which is formed a layer of a metal or alloy and is obtained by plating in a metal plating solution containing a suitable amount of bismaleimide an its derivatives.

The third object of the present invention is attained by coating the above metal layer-covered copper foil of the invention with precursors of polyimide, and then thermally imidizing the coated precursors.

This metal layer-covered metal foil can be prepared from a metal plating solution at a temperature higher than 90° C. The resulting metal foil has an acceptable bond strength and is suitable to be subjected to a subsequent process at temperatures as high as 400° C. This metal plated copper foil is particularly suitable for being bonding on polyimide substrate. This is due to the fact that the bismaleimide added to the plating solution has a higher softening point so that it will not soften to resist the electrodeposition and is thermally stable in the subsequent process.

DETAILED DESCRIPTION OF THE INVENTION

According to the present invention, bismaleimide (BMI) and its derivatives can be added into any kind of metal plated solution, such as plating solution of copper, nickel, gold, chromium, silver, rhodium, palladium, platinum, zinc, cadmium, tin, lead etc. to form a metal layer on the metal foil. Nickel or Copper plated solution is particularly suitable for the purpose of this invention. As noted above, the metal plated copper foil of the present invention is particularly suitable for being bonding on polyimide substrate, for example, a polyimide film, because the BMI added in the plating solution will form insoluble fine particles on the surface of the plated copper foil, and this film of BMI fine particles will assist the bonding of metal foil and polyimide substrate. The plated metal sheet of the present invention is also suitable to be bonded on BMI film, BMI impregnated material, PEI (polyetherimide) and PAI (polyamideimide).

The polyimide substrate usable in the present invention can be a polyimide of the BPDA/PDA/ODA system, BPDA/BTDA/PDA/ODA system, or other polyimide systems containing BPDA, BTDA, PMDA, HFDA, PDA, ODA, DDK, DDS, DMB, DSDA and BDAF, in which BPDA represents Biphenyl tetracarboxylic dianhydride, PDA represents p-phenylene diamine, ODA represents 4,4'-Oxydianiline, BTDA represents Benzophenone tetracarboxylic dianhydride, PMDA represents pyromellitic dianhydride HFDA represents 2,2-bis(3,4-dicarboxylphenyl)hexafluoropropane dianhydride, DDK represents 3,3'-diaminobenzophenone, DDS represents 3,3'Diaminodiphenyl sulfone, DMB represents dimethylbenzidine, DSDA represents 3,3',4,4',-diphenylsulfonetetracarboxylic dianhydride, BDAF represents 2,2-bis[4-(4-aminophenoxy)phenyl]hexafluoropropane.

The bismaleimide and its derivatives used in the present invention having the following structural formula:

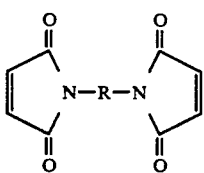

wherein R is selected from the group consisting of

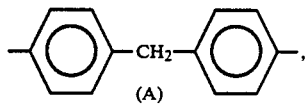

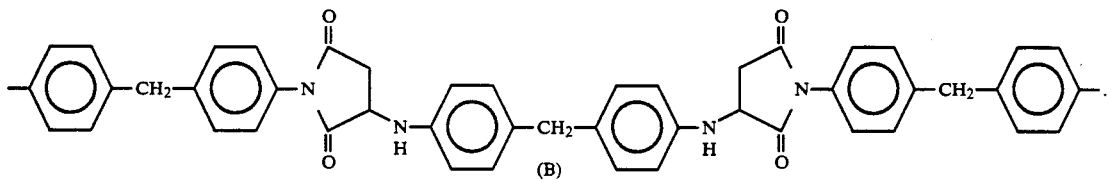

$-(CH_2)_2-$, $-(CH_2)_6-$, $-(CH_2)_8-$, $-(CH_2)_{12}-$

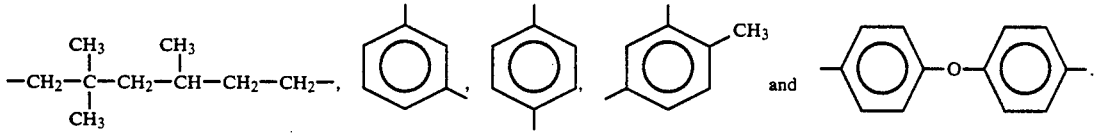

The bismaleimide with the R being (A) or (B) are particularly preferred for being used in the present invention. For example, Kerimid 601 ( bismaleimide with R being (B), available from Rhone-Poulenc CO. and bismaleimide-s ( bismaleimide with R being (A), available from MITSUI CO. ) is particularly useful for the method of the present invention.

The metal sheet bonding to the polyimide film can be for example, a copper foil, aluminum foil, a nickel foil and a resistance foil.

This invention will be more clearly understood by referring to the following illustrative examples.

EXAMPLE 1

Copper foil was degreased for one minute and then was washed with deionized water. Then, said copper foil was dipped into a 5 % NaOH solution and was washed with deionized water. The pretreated copper foil was plated in a plating solution under the operational condition as shown in Table 1, in which the plating solution was prepared by first adding 800 ml of deionized water in a 1000 ml beaker and then adding 240 g of $NiCl_2.6H_2O$ and mixing well till complete dissolution of the $NiCl_2.6H_2O$ occurred, and then adding 125 ml of conc.HCl, 20 g of Kerimide 601 and 100 mg of Sinonate 290MH into the beaker and finally adding deionized water until its volume reached 1000 ml. The pretreated copper foil was also plated for comparison in the same manner as above except that no Kerimide 601 and Sinonate 290MH was added. The nickel layer-covered copper foil of the invention and of the comparative product were coated with polyamic acid to form a coating layer thereon. The coating layer was then subjected to thermal imidization of 350° C. to form a polyimide coating layer. The laminates thus produced were tested for their peel strength, which was found to be 3.6 lb/in for a comparative product and 7.2 ib/in for the product of the present invention.

TABLE 1

|  | comparative product | invented product |
|---|---|---|
| plating conditions |  |  |
| Kerimid 601* (g/l) | 0 | 20 |
| $NiCl_2.6H_2O$ (g/l) | 240 | 240 |
| conc. HCl (ml/l) | 125 | 125 |
| Sinonate 290 MH** (mg/l) | 0 | 100 |
| temperature | room temp. | room temp. |
| current density (mA/cm$^2$) | 50 | 50 |
| time of electrolysis (sec) | 30 | 30 |
| Property of laminate |  |  |
| 90° peel strength (ib/in) | 3.6 | 7.2 |

Polyimide system: BPDA/PDA/ODA
*Product From Rhone-Poulenc Company
**Product From SINO-JAPAN Chemical Co., Ltd.

EXAMPLE 2

The procedure of Example 1 was followed except that the plating condition used was replaced by that shown in Table 2. Table 2 indicates that the peeling strength was found to be 2.7 lb/in for comparative products and 8.23 lb/in of the product of the present invention.

TABLE 2

|  | comparative product | invented product |
|---|---|---|
| Plating conditions |  |  |
| bismaleimide-s* (g/l) | 0 | 20 |
| $CuSO_4.5H_2O$ (g/l) | 180 | 180 |
| Conc. $H_2SO_4$ (ml/l) | 40 | 40 |
| temperature | room temp. | room temp. |
| current density (mA/cm$^2$) | 120 | 120 |
| time of electrolysis (sec) | 15 | 15 |
| Property of laminate |  |  |
| 90° peel strength (lb/in) | 2.7 | 8.2 | system: BPDA/BTDA/PDA/ODA
*product from MITSUI company

EXAMPLE 3

The procedure of Example 1 was followed except that the plating condition used was replaced by that shown in Table 3. It is shown in Table 3 that the peel strength of the comparative product was 3.3 lb/in and the peel strength of the product of the present invention was 6 1 lb/in.

TABLE 3

| Plating conditions | comparative product | invented product |
|---|---|---|
| bismaleimide-S* (g/l) | 0 | 20 |
| Ni(NH$_2$SO$_3$)$_2$ (g/l) | 450 | 450 |
| H$_3$BO$_3$ (g/l) | 30 | 30 |
| temperature (°C.) | 50 | 50 |
| current density (mA/cm$^2$) | 30 | 30 |
| time of electrolysis (sec) | 50 | 50 |
| Property of laminate | | |
| 90° peel strength (lb/in) | 3.3 | 6.1 | system: BPDA/PDA/ODA
*Product from MITSUI

Comparative Example

The copper foil and plating solution were prepared as in Example 3 except that bismaleimide was replaced by epoxy resin. Electrodeposition could not be carried out in this example since epoxy resin was softened at high temperature and formed a film on copper foil which resisted the electrodeposition. Plating condition is summarized in table 4.

TABLE 4

| EPON 1001* (epoxy resin) (g/l) | 20 |
|---|---|
| Ni(NH$_2$SO$_3$)$_2$ (g/l) | 450 |
| H$_3$BO$_3$ (g/l) | 30 |
| temperature (°C.) | 50 |
| current density (mA/cm$^2$) | 30 |

*product from Shell Company.

From the above examples, it is showed that the present invention provides a method for improving the bonding of polyimide film to metal sheet. The peeling strength is higher than 4 lb/in, i.e. 7.2 lb/in for example 1, 8.2 lb/in for example 2 and 6.1 lb/in for example 3, which meets the utilization standard in the production of circuit electronic boards. Furthermore, the resulting product can be subject to a subsequent processing at a temperature as high as 400° C.

What is claimed is:

1. A method for electroplating a metal sheet, comprising:
   electroplating said metal sheet in a metal plated solution, wherein bismaleimide and its derivatives is added into said metal plated solution.

2. A method for electroplating a metal foil as claimed in claim 1, wherein said bismaleimide and its derivatives has the structural formula of:

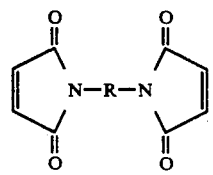

wherein R is

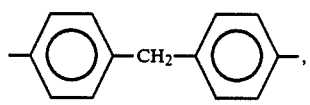

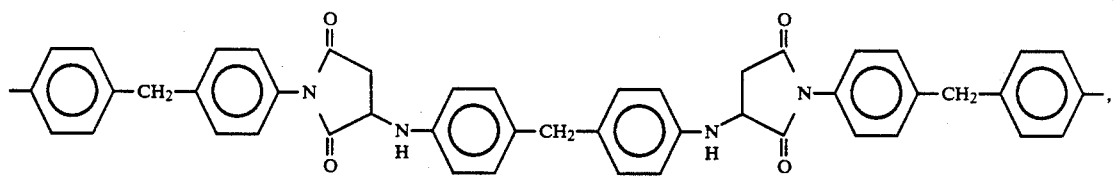

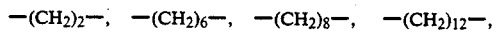

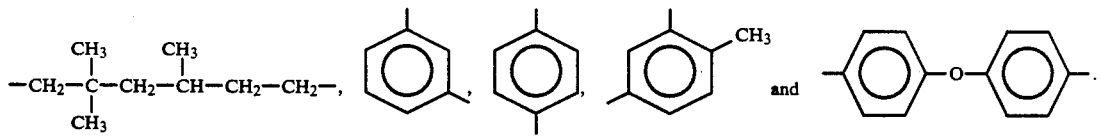

3. A method for electroplating a metal sheet as claimed in claim 2, wherein R of said bismaleimide and its derivatives is

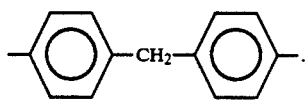

4. A method for electroplating a metal sheet as claimed in claim 2, wherein R of said bismaleimide and its derivatives is

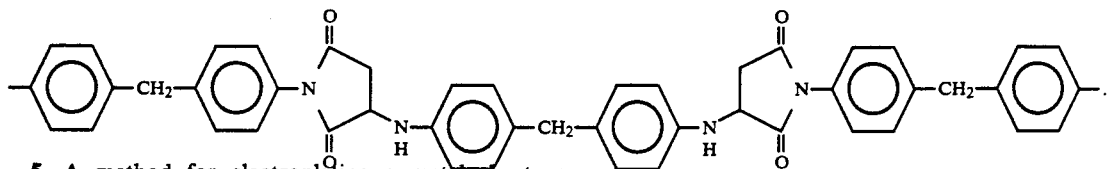

5. A method for electroplating a metal sheet as claimed in claim 1, wherein said metal sheet is a copper foil.

6. A method for electroplating a metal sheet as claimed in claim 1, wherein said metal foil is a nickel foil.

7. A method for electroplating a metal sheet as claimed in claim 1, wherein said metal sheet is an aluminum foil.

8. A method for electroplating a metal sheet as claimed in claim 1, wherein said metal sheet is a resistance foil.

9. A method for bonding a metal sheet to a polyimide film, comprising the following steps:
   a) electroplating said metal sheet according the method as claimed in claim 1,
   b) applying polyamic acid on one surface of said metal sheet prepared in step a) to form a coating layer thereon, and
   c) thermal imidizing said layer to form said polyimide film.

10. A method for bonding a metal sheet to a polyimide film as claimed in claim 9, wherein said bismaleimide and its derivatives has the structural formula of:

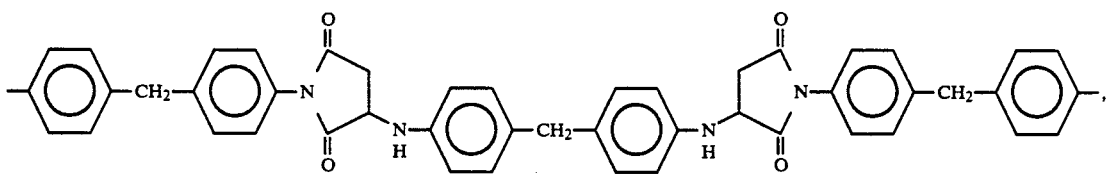

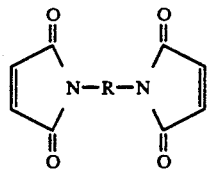

wherein R is

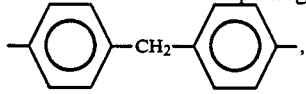

—(CH$_2$)$_2$—, —(CH$_2$)$_6$—, —(CH$_2$)$_8$—, —(CH$_2$)$_{12}$—,

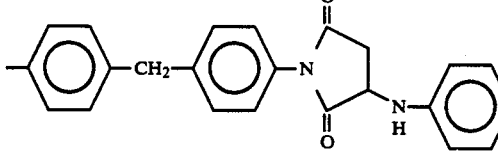, 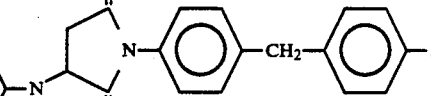 and

11. A method for bonding a metal sheet to a polyimide film as claimed in claim 10, wherein R of said bismaleimide and its derivatives is

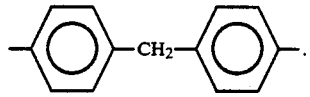

12. A method for bonding a metal sheet to a polyimide film as claimed in claim 10, wherein R of said bismaleimide and its derivatives is

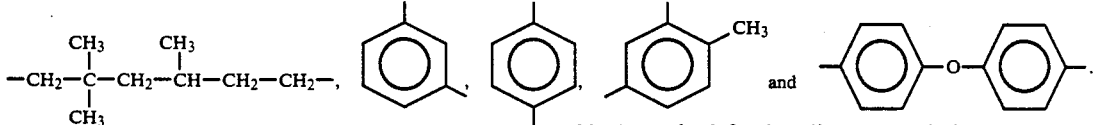

13. A method for bonding a metal sheet to a polyimide film as claimed in claim 9, wherein said metal sheet is a copper foil.

14. A method for bonding a metal sheet to a polyimide film as claimed in claim 9, wherein said metal foil is a nickel foil.

15. A method for bonding a metal sheet to a polyimide film as claimed in claim 9, wherein said metal sheet is an aluminum foil.

16. A method for bonding a metal sheet to a polyimide film as claimed in claim 9, wherein said metal sheet is a resistance foil.

17. A method for bonding a metal sheet to a polyimide film as claimed in claim 9, wherein said thermal imidization is carried out at a temperature of 350° C.

* * * * *